United States Patent [19]

Lay

[11] Patent Number: 4,990,493

[45] Date of Patent: Feb. 5, 1991

[54] PROCESS OF MAKING AN ORIENTED POLYCRYSTAL SUPERCONDUCTOR

[75] Inventor: Kenneth W. Lay, Schenectady, N.Y.

[73] Assignee: General Electric Company, Schenectady, N.Y.

[21] Appl. No.: 240,296

[22] Filed: Sep. 6, 1988

[51] Int. Cl.$^5$ .......................... B01L 39/12; H01F 1/10
[52] U.S. Cl. ........................................ 505/1; 148/108; 252/521; 264/24; 264/108; 505/803
[58] Field of Search ..................... 505/1, 803; 252/521; 264/24, 108; 148/108

[56] References Cited

U.S. PATENT DOCUMENTS

| | | | |
|---|---|---|---|
| 3,596,350 | 8/1971 | Steingroever | 264/108 |
| 3,615,915 | 10/1971 | Luiten | 264/24 |
| 3,676,273 | 7/1972 | Graves | 264/108 |
| 3,867,299 | 2/1975 | Rohatgi | 264/24 |
| 4,222,814 | 9/1980 | Reitz | 156/612 |

FOREIGN PATENT DOCUMENTS

| | | | |
|---|---|---|---|
| 56-4435A | 1/1981 | Japan | 264/108 |
| 8809312 | 12/1988 | PCT Int'l Appl. | |
| 3079125 | 8/1971 | U.S.S.R. | 264/24 |

OTHER PUBLICATIONS

Murphy "New Superconducting Cuprate Peroskites", Phy. Rev. Lttrs. vol. 58, No. 18, May 4, 1987, p. 1888–1890.
Tsurumi "High-T$_1$ Superconductivities of $(Y_{1-x}Yb_x)_2Ba_2Cu_6O$", Jap. Jnl. App. Phys., vol. 26, No. 5, May 1987, pp. L704–L705.
Solin, "Field-Induced Orientation of Nonlevitated Microcrystals", Phys. Rev. Lttrs., vol. 60, No. 8, Feb. 22, 1988, pp. 744–747.
Ferreira "Magnetic Field Alignment of High-Tc Super", . . . Appl. Phys. A 47, pp. 105–110.
Stripp "Lab vs. Factory: Fabrication of Products . . . ", Wall Street Journal, Jul. 9, 1987, pp. 1 and 23.
McKinnon, "Rare-Earth Doping of High Tc Superconducting . . . ", Proceeding MRS Conference, Apr., 1987, p. 185–187.
Kishio, "Superconductivity Acheived at Over Liquid . . . ", Jap. Jnl of Appl. Phys., vol. 26, No. 5, May 1987, pp. L694–696.
Lee, "Microstructural Details and Magnetic Properties of . . . ", Proceedings: MRS Conference, Apr., 1987, pp. 263–266.
Thompson, "Magnetization and Susceptibility Studies . . . ", Physical Review B [Preprint] Jul. 1, 1987.
Tranquada, "Observation of Alignment of Superconducting . . . ", Physical Review B vol. 37(1), Jan. 1, 1988, pp. 519–521.
Varadaraju, "Effect of Chemical Substitution on the . . . ", Physica 148 (B) 1987, pp. 417–418.
Suzuki, "Rare-Earth (RE)-Barium Solubility . . . ", Jap. Jnl. App. Phys., vol. 27, No. 5, May 1988, pp. L792–794.
Sampathkumaran, "Absence of Solid Solution of the Type . . . ", Jap. Jnl. Appl. Phys., vol. 17, No. 4, Apr. 1988, pp. L584–586.
"University New", Superconductor News, Mar./Apr. 1988, p. 7.
"Getting Warmer", Scientific American, Oct. 1987, pp. 33–34.
Solin, "X-ray Studies of Field-Induced Orientations . . . ", Physica C, 153–155 (Pt. 1) 1988, pp. 986–987 (Abstract).

Primary Examiner—Paul Lieberman
Assistant Examiner—John Boyd
Attorney, Agent, or Firm—Jane M. Binkowski; James C. Davis, Jr.; James Magee, Jr.

[57] ABSTRACT

A superconductive polycrystalline body is produced having a composition selected from the group consisting of $Y_{1-x}(Ln)_xBa_2Cu_3O_{7-y}$, $La_{1-x}(Ln)_xBa_2Cu_3O_{7-y}$ and a combination thereof wherein x ranges from about 0.01 to about 0.5, y ranges up to about 0.3, and where Ln is selected from the group consisting of Nd, Sm, Eu, Gd, Dy, Ho, Er, Tm, Yb and a combination thereof.

45 Claims, No Drawings

PROCESS OF MAKING AN ORIENTED POLYCRYSTAL SUPERCONDUCTOR

This invention relates to the production of an oriented polycrystal superconductor with the major constituents $YBa_2Cu_3O_{7-y}$ (Y-123) and/or $LaBa_2Ca_3O_{7-y}$ (La-123) using oriented Ln-123 seed crystals.

The art has made high temperature superconductors with the 123 composition containing Y or most of the lanthanide group from La to Lu. The exception seems to be the lanthanides which have fairly stable 4+ ions—Ce, Pr, and Tb. Most of the work to-date has been done with the Y-123 compound It has been found that this material has quite anisotropic superconducting properties In particular the critical current is much higher in the (001) plane than out of the plane. It may be that bulk polycrystalline samples with randomly oriented grains will not exhibit high critical currents due to the misorientation of adjacent grains. If this is the case, it means that any application which requires a superconductor with a high current carrying capacity will require either a single crystal or a polycrystal with a high degree of ordering of the grains. Traditional ceramic forming techniques based on forming a body from a powder and then densifying the body by sintering would be the preferred technique for making bulk superconductors of 123. Unfortunately this results in random orientations of the grains in the dense body. A simple technique of orienting the grains is desired.

One method which has been demonstrated to result in aligned grains in a polycrystalline sintered body is to use the anisotropic magnetic susceptibility of the materials. It has been shown that crystals of the 123 materials will align in a magnetic field Y-123, Dy-123, and Ho-123 align with the c-axis of the crystal parallel to the magnetic field Eu-123, Gd-123, and Er-123 align with the c-axis of the crystal perpendicular to the magnetic field The magnetic susceptibility of the Y- and La-123 compounds are due to the copper ions and the conduction electrons. The magnetic susceptibilities of the Ln-123 compounds where Ln ranges from Pr to Yb, on the other hand have much larger susceptibilities (and anisotropies in the susceptibilities) due to the magnetic moments on the Ln ions. Neither Y or La are magnetic ions.

Briefly stated, the present process comprises providing a matrix powder selected from the group consisting of $YBa_2Cu_3O_{7-y}$, $LaBa_2Cu_3O_{7-y}$ and a combination thereof wherein y ranges from zero to about 1, providing $LnBa_2Cu_3O_{7-y}$ seed crystals where Ln is selected from the group consisting of Nd, Sm, Eu, Gd, Dy, Ho, Er, Tm, Yb and a combination thereof and wherein y ranges from zero to about 1, said seed crystals having an average particle size of at least about twice as large as the average particle size of said matrix powder, forming a mixture of said matrix powder and seed crystals, said seed crystals ranging from about 1% by volume to about 50% by volume of said mixture, applying an aligning magnetizing field to said mixture to at least substantially align said seed crystals along their preferred axis of magnetization, forming the resulting aligned material into a compact wherein said seed crystals are substantially aligned along their preferred axis of magnetization, sintering said compact in an oxidizing atmosphere at a temperature ranging from about 900° C. to below the melting point of said mixture producing a sintered body having an open porosity ranging from zero to about 20% by volume of said body, and cooling said body in an oxidizing atmosphere at a rate which produces a superconductive body.

The matrix powder is a sinterable powder selected from the group consisting of $YBa_2Cu_3O_{7-y}$, $LaBa_2Cu_3O_{7-y}$ and a combination thereof, where y ranges from 0 to about 1, frequently from 0 to about 0.7.

The matrix powder can be of any particle size which is sinterable in the present process Generally, it has an average particle size ranging from submicron to about ten microns, frequently from about 0.1 micron to about 5 microns, or from about 0.2 micron to about 4 microns.

The seed crystals, i.e. seed powder, is comprised of $LnBa_2Cu_3O_{7-y}$ wherein y ranges from 0 to about 1, frequently from 0 to about 0.7. Ln is selected from the group consisting of Nd, Sm, Eu, Gd, Dy, Ho, Er, Tm, Yb and a combination thereof.

The seed crystals are sinterable in the present process. They can range in size but should have an average particle size at least twice as large, or at least about three times as large, as the average particle size of the sinterable powder. Generally, however, the maximum average particle size of the seed crystals is about 10 microns, and preferably it is about 3 microns.

Average particle size herein can be determined by conventional techniques.

The matrix powder and seed crystals may be commercially available or may be produced by methods known in the art. For example, they can be produced by reacting the oxides of the components of the compounds in the required amounts in oxygen or air at atmospheric pressure at temperatures of the order of about 900° C. to 950° C.

The matrix powder and seed crystals are admixed to form a mixture which preferably is uniform or substantially uniform in order to produce a sintered product with a microstructure which preferably is uniform or substantially uniform. Mixing of the powders can be carried out by a number of conventional techniques such as, for example, ball milling.

Generally, the seed crystals range from about 1% to about 50% by volume of the powder mixture comprised of the matrix powder and seed crystals. Seed crystals of less than about 1% by volume may not be effective since considerable grain growth of the seeds is required to convert all the sample to aligned grains. Seed crystals higher than about 50% by volume would not be economically practicable. Preferably, the seed crystals range from about 1% to about 40%, or from about 5% to about 20%, by volume of the mixture of matrix powder and seed crystals.

In carrying out the present process, an aligning magnetizing field is applied preferably at room temperature to the powder mixture to align, or at least substantially align, the seed crystals along their preferred axis of magnetization which is parallel or perpendicular to the "C" axis. The aligning magnetizing field is applied to the powder mixture before it is formed into a compact, and preferably, it is maintained during shaping of the powder mixture into a compact. Generally, the aligning magnetizing field ranges from about 1 kiloersted to about 100 kiloersteds and is determined empirically.

A number of conventional procedures can be used to form the powder mixture into a compact. For example, the powder mixture can be extruded, injection molded, die-pressed, slip cast or tape cast to produce the compact of desired shape. Specifically, in one technique, an aligning magnetizing field can be applied to the powder mixture, frequently in the form of a layer, in a press and the aligned material can be compressed, preferably in the magnetizing field, to produce the compact.

In another technique, the powder mixture is dispersed in an organic liquid such as heptane to form a slurry, the slurry placed in a suitable firing container such as an alumina boat, an aligning magnetizing field is applied to the slurry and maintained while the liquid evaporates away thereby forming the present aligned compact in the container which is then fired to produce the present sintered product.

In another technique, a slurry of the powder mixture is slip cast in a conventional manner in a porous mold in an aligning magnetizing field thereby forming the present aligned compact.

In still another technique, a slurry of the powder mixture is cast into tape in an aligning magnetizing field.

Lubricants, dispersants, binders or similar form-promoting materials useful in producing the compact can be admixed with the powder mixture. Such materials are well known in the art and can be used in a conventional manner with the particular amount thereof being determined empirically. Generally, they are organic preferably of the type which evaporate or decompose on heating at relatively low temperatures, preferably below 500° C., leaving no residue or no significant residue. The form-promoting material should permit magnetic alignment of the seed crystals and should have no significant deleterious effect in the present process.

The compact should have a density at least sufficient to produce the present sintered body. Preferably, it has a density of at least about 45% of its theoretical density to promote densification during sintering.

Sintering of the compact is carried out in an oxidizing atmosphere which generally is about atmospheric pressure. The oxidizing atmosphere should be at least sufficiently oxidizing to produce a sintered body wherein the O, i.e. oxygen, component has a value of at least about 6.0. Generally, the sintering, i.e. firing, atmosphere contains at least about 1% by volume of oxygen and the remainder of the atmosphere should be a gas which has no significant deleterious effect on the sintered product. Representative of such gases is nitrogen or a noble gas such as argon or helium Most preferably, the sintering atmosphere is comprised of oxygen.

Sintering is carried out at a temperature ranging from about 900° C. to below the melting temperature of the constituents of the body. Generally, sintering temperature ranges from about 900° C. to about 1000° C., and typically it ranges from about 950° C. to about 975° C. The particular sintering temperature is determined empirically and depends largely on particle size, density of the compact and final density desired in the sintered product. Generally, higher sintering temperatures are required to produce sintered bodies of higher density.

Sintering time can vary and is determined empirically. Sintering is carried out until all or substantially all of the matrix powder has been engulfed or consumed by the seed crystals. Specifically, sintering is carried out until no significant amount, or no detectable amount, of matrix powder remains. By no detectable amount of matrix powder, it is meant herein not detectable microscopically. Generally, sintering time ranges from about two hours to eight hours.

During sintering, i.e. densification, there is grain growth whereby the large grains grow at the expense of the small grains, i.e. at the expense of the matrix powder. There is a crystal growth of one material on another and the small grains disappear. This results in a preferred orientation of the grains in the final ceramic part. The amount of grain growth of the seed crystals required to remove substantially all the small grains is a function of the volume fraction of seed crystals. A smaller volume fraction of seeds requires more grain growth.

The sintered body is cooled in an oxidizing atmosphere generally at about atmospheric pressure at a rate which produces the present superconductive body. The cooling schedule can vary and is determined empirically. Generally, the cooling oxidizing atmosphere contains at least about 20% by volume of oxygen and the remaining gas should have no significant deleterious effect on the superconductive product. Preferably, the oxidizing atmosphere is air but more preferably it is oxygen.

Specifically, during the cooling procedure, generally at a temperature ranging from about 700° C. to about 400° C., the sintered body should be cooled at a rate sufficient to produce the orthorhombic crystal structure in an amount at least sufficient to produce the superconductive body. Generally, in this temperature range of about 700° C. to about 400° C. additional oxygen is incorporated into the body. Sufficient oxygen should be incorporated in the body to permit formation of the required orthorhombic crystal structure.

Cooling of the body from about 400° C. can be at a more rapid rate, but not so fast as to fracture the body by thermal shock. The body is usually cooled to room temperature, i.e. from about 20° C. to about 30° C. The present process has no significant effect on the amounts of the other, i.e. non-oxygen, components of the body.

The sintered body and the resulting superconductive body have the same density or porosity. The body may have some closed porosity and generally has open porosity. Preferably, pores are small, preferably less than one micron, and sufficiently distributed in the body so that they have no significantly deleterious effect on mechanical properties. Porosity can be determined by standard metallographic techniques, such as, for example, optically examining a polished cross section of the body.

By closed porosity, it is meant herein closed pores or voids in the sintered body, i.e. pores not open to the surface of the body and therefore not in contact with the ambient atmosphere. Generally, closed porosity ranges from 0 to about 10%, preferably it is less than about 5%, or less than about 1% by volume of the body.

By open porosity, it is meant herein pores or voids which are open to the surface of the sintered body, thereby making the interior surfaces accessible to the ambient atmosphere.

The sintered body should have sufficient surface area to permit production of the superconductive body and this is determined empirically. Specifically, the sintered body, during cooling thereof in an oxidizing atmosphere, should have at least sufficient surface area for contact with oxygen to allow production of the superconductive body. Generally, a portion of the surface area of the sintered body is provided by its open porosity. For a very thin body, open porosity may not be needed. Generally, the present superconductive body has an open porosity ranging from 0 to about 20%, frequently from about 2% to about 20%, or from about 5% to about 15%, by volume of the body. Typically, open porosity ranges from about 7% to about 10% by volume of the body.

Generally, the present superconductive sintered body is comprised of grains which are disc-like irregular plates or polygons, i.e. the edge of the plate is irregular. Grain size in the longest direction is at least about 5 microns and can range widely depending largely on the size and volume fraction of seed crystals used in the process. For example, grain size in the longest direction can range from about 5 microns to about, or greater than about, 100 microns. Frequently, grain size in the longest direction ranges from about 10 microns to about 80 microns.

The orientation of the grains in the superconductive body depends largely on the orientation of the seed crystals in the process. Generally, when the seed crystals align with their c-axis parallel to the orienting magnetic field, the plates in the resulting superconductive body are stacked together. Generally, when the seed crystals align with their c-axis perpendicular to the orienting magnetic field, the plates in the resulting superconductive body can be oriented in any direction, i.e. they can be arranged in 360 degrees, except that the c-direction is in a common plane perpendicular to the orienting magnetic field.

In the prior art, the Y-123 and La-123 sintered bodies were comprised of non-aligned grains and were restricted to a grain size generally of about 2 to 3 microns since a larger grain size would cause the material to crack on heating. In contrast to the prior art, the present superconductive body has a significant anisotropic thermal expansion since its grains are aligned. As a result, there is no restriction on grain size. Generally, grain boundaries are weak links and reduce critical current. Since the grains of the present superconductive body are relatively large, there are fewer grain boundaries thereby enhancing critical current.

The present superconductive body has a composition selected from the group consisting of $Y_{1-x}(Ln)_xBa_2Cu_3O_{7-y}$, $La_{1-x}(Ln)_xBa_2Cu_3O_{7-y}$ and a combination thereof where x ranges from about 0.01 to about 0.5 and where y ranges from zero to about 0.3. Preferably, x ranges from about 0.01 to about 0.4, or from about 0.05 to about 0.2. Preferably, y ranges from zero to about 0.2. The particular values of x and y are determined empirically and depend largely on the particular superconductive body desired.

The present superconductive body contains the orthorhombic crystal structure in an amount at least sufficient to give the desired superconductivity. Generally, the presence of the orthorhombic phase can be determined by x-ray diffraction analysis, transmission electron microscopy, or polarized light microscopy. The superconductive body is polycrystalline.

Superconductivity of the present body can be determined by conventional techniques For example, it can be demonstrated by magnetic flux exclusion, the Meisner effect. Generally, the present superconductive body has a zero resistance transmission temperature, i.e. a temperature at which there is no electrical resistance, greater than about 77K, preferably at least about 85K and most preferably higher than about 90K.

The present superconductive body is useful as a conductor for magnets, motors, generators, and power transmission lines.

The invention is further illustrated by the following example:

EXAMPLE 1

A powder mixture comprised of 38.26 grams of $Er_2O_3$, 47.72 grams of CuO, and 78.94 grams of $BaCO_3$ was reacted at about 870° C. in air at about atmospheric pressure for about 12 hours and at about 905° C. in air for about 2 hours. X-ray diffraction of the resulting seed crystals showed the presence of only the 123 phase. This material was then heated in air at about atmospheric pressure for about 20 hours at about 950° C. to increase its particle size. The material was lightly milled to separate the particles. From single point BET surface area measurement of the resulting seed crystals, a spherical equivalent average crystal diameter of about 3.2 microns was calculated which is an indication of their relative size. The seed crystals were comprised of $ErBa_2Cu_3O$ where, from other work, it was known that O fell in the range of from about 6 to 7.

The matrix powder was comprised of $YBa_2Cu_3O$(Y-123) where from other work it was known that O fell in the range of from about 6 to 7. The spherical equivalent average crystal diameter of the matrix powder was 0.72 microns as calculated from BET surface area measurement.

About 78.1 grams of the Y-123 matrix powder were admixed with about 21.9 grams of the Er-123 seed crystals in a liquid medium of heptane at room temperature to form a slurry. A few drops of an organic material sold under the trademark Sarkosyl-O was added as a dispersing agent.

The resulting slurry was placed in an alumina boat and an aligning magnetizing field of about 40 kiloersteds was applied to the slurry at room temperature in air. The magnetizing field was maintained for about 16 hours during which time the liquid had evaporated away. The alumina boat supporting the resulting compact was placed in an alumina tube furnace.

The compact was sintered in flowing oxygen at about atmospheric pressure at a temperature of about 950° C. for 10 hours. The sintered body was then cooled in the furnace in flowing oxygen at about atmospheric pressure to room temperature. Specifically, it was cooled at a rate of about 20° C. per hour to room temperature. The oxygen flow rate was about 1 cubic foot per hour.

The resulting superconductive sintered body was cut into sample pieces.

X-ray diffraction of a sample showed only the presence of a 123 phase.

X-ray diffraction analysis of the sample showed the grains to be aligned with their c-axis perpendicular to the direction of the magnetic field during fabrication. This is the expected direction for alignment of the Er-123 seed crystals. Any preferred alignment of the smaller Y-123 crystals in the magnetic field would have been with the c-axis parallel to the field. The absence of grains oriented in this direction in the final sample indicates substantially all the original Y-123 crystals have been engulfed in the large grains resulting from growth of the Er-123 seed crystals.

Examination of polished samples by polarized light microscopy showed the twins within the grain expected for the superconductivity phase. Grains varying from about 10 microns up to 70 microns in the longest dimension were seen. Many of the grains were about 20 to 30 microns in longest dimension. Grain thicknesses were smaller with many about 10 microns. Anisotropic grain shapes with the c-direction thinner than the other 2 directions are common in -123 materials. The absence of small grains in the micrographs showed the Y-123 grains were engulfed within the growing Er-123 seed grains.

The sample showed superconductivity at 77K as demonstrated by magnetic flux exclusion, the Meisner effect.

From other work, it was known that the superconductive sintered body was comprised of $Y_{0.80}Er_{0.20}Ba_2Cu_3O_{7-y}$, where y is about 0.2 or less and that it had an open porosity of about 10% by volume.

This superconductive body would be useful as a conductor for a magnet, motor, generator, or any other application where a high current, low loss conductor is desired.

What is claimed is:

1. A process for producing a superconductive sintered body which comprises providing a matrix powder selected from the group consisting of $YBa_2Cu_3O_{7-y}$, $LaBa_2Cu_3O_{7-y}$, and a combination thereof wherein y ranges from zero to about 1, providing $LnBa_2Cu_3O_{7-y}$ seed crystals where Ln is selected from the group consisting of Nd, Sm, Eu, Gd, Dy, Ho, Er, Tm, Yb, those combinations thereof wherein the seed crystals have a preferred axis of magnetization which is parallel to the c-axis, or those combinations thereof wherein the seed crystals have a preferred axis of magnetization which is perpendicular to the c-axis, and wherein y ranges from zero to about 1, said seed crystals having an average particle size at least about twice as large as the average particle size of said matrix powder, forming a mixture of said matrix powder and seed crystals, said seed crystals ranging from about 1% by volume to about 50% by volume of said mixture, applying an aligning magnetizing field to said mixture to at least substantially align said seed crystals along their preferred axis of magnetization, forming the resulting aligned material into a compact wherein said seed crystals are substantially aligned along their preferred axis of magnetization, sintering said compact in an oxidizing atmosphere at a temperature ranging from about 900° C. to below the melting point of said mixture producing a sintered body having an open porosity ranging from zero to about 20% by volume of said body, and cooling said body in an oxidizing atmosphere at a rate which produces a superconductive body.

2. The process according to claim 1, wherein y ranges from zero to about 0.7.

3. The process according to claim 1, wherein said matrix powder has an average particle size ranging from submicron to about 10 microns.

4. The process according to claim 1, wherein said seed crystals range from about 1% to about 40% by volume of said mixture.

5. The process according to claim 1, wherein said seed crystals range from about 5% to about 20% by volume of said mixture.

6. The process according to claim 1, wherein said aligning magnetizing field is also applied to said mixture during said forming into a compact.

7. The process according to claim 1, wherein said sintering is carried out in oxygen.

8. The process according to claim 1, wherein said sintering temperature ranges from about 900° C. to about 1000° C.

9. The process according to claim 1, wherein said cooling is carried out in oxygen.

10. The process according to claim 1, wherein said Ln is Er.

11. The process according to claim 1, wherein said Ln is Nd.

12. The process according to claim 1, wherein said Ln is Sm.

13. The process according to claim 1, wherein said Ln is Gd.

14. The process according to claim 1, wherein said Ln is Dy.

15. The process according to claim 1, wherein said Ln is Ho.

16. The process according to claim 1, wherein said Ln is Tm.

17. The process according to claim 1, wherein said Ln is Yb.

18. A process for producing a superconductive sintered body which comprises providing a matrix powder of $YBa_2Cu_3O_{7-y}$ wherein y ranges from zero to about 1, providing $LnBa_2Cu_3O_{7-y}$ seed crystals where Ln is selected from the group consisting of Nd, Sm, Eu, Gd, Dy, Ho, Er, Tm, Yb, those combinations thereof wherein the seed crystals have a preferred axis of magnetization which is parallel to the c-axis, or those combinations thereof wherein the seed crystals have a preferred axis of magnetization which is perpendicular to the c-axis, and wherein y ranges from zero to about 1, said seed crystals having an average particle size at least about twice as large as the average particle size of said matrix powder, forming a mixture of said matrix powder and seed crystals, said seed crystals ranging from about 1% by volume to about 50% by volume of said mixture, applying an aligning magnetizing field to said mixture to at least substantially align said seed crystals along their preferred axis of magnetization, forming the resulting aligned material in an aligning magnetizing field into a compact wherein said seed crystals are substantially aligned along their preferred axis of magnetization, sintering said compact in an oxidizing atmosphere at a temperature ranging from about 900° C. to below the melting point of said mixture producing a sintered body having an open porosity ranging from zero to about 20% by volume of said body, and cooling said body in an oxidizing atmosphere at a rate which produces a superconductive body.

19. The process according to claim 18, wherein Ln is Nd.

20. The process according to claim 18, wherein Ln is Sm.

21. The process according to claim 18, wherein Ln is Eu.

22. The process according to claim 18, wherein Ln is Gd.

23. The process according to claim 18, wherein Ln is Dy.

24. The process according to claim 18, wherein Ln is Ho.

25. The process according to claim 18, wherein Ln is Er.

26. The process according to claim 18, wherein Ln is Tm.

27. The process according to claim 18, wherein Ln is Yb.

28. A process for producing a superconductive sintered body which comprises providing a matrix powder of $LaBa_2Cu_3O_{7-y}$ wherein y ranges from zero to about 1, providing $LnBa_2Cu_3O_{7-y}$ seed crystals where Ln is selected from the group consisting of Nd, Sm, Eu, Gd, Dy, Ho, Er, Tm, Yb, those combinations thereof wherein the seed crystals have a preferred axis of magnetization which is parallel to the c-axis, or those combinations thereof wherein the seed crystals have a preferred axis of magnetization which is perpendicular to the c-axis, and wherein y ranges from zero to about 1, said seed crystals having an average particle size at least about twice as large as the average particle size of said matrix powder, forming a mixture of said matrix powder and seed crystals, said seed crystals ranging from about 1% by volume to about 50% by volume of said mixture, applying an aligning magnetizing field to said mixture to at least substantially align said seed crystals along their preferred axis of magnetization, forming the resulting aligned material in an aligning magnetizing field into a compact wherein said seed crystals are substantially aligned along their preferred axis of magnetization, sintering said compact in an oxidizing atmosphere at a temperature ranging from about 900° C. to below the melting point of said mixture producing a sintered body having an open porosity ranging from zero to about 20% by volume of said body, and cooling said body in an oxidizing atmosphere at a rate which produces a superconductive body.

29. The process according to claim 28, wherein said Ln is Nd.

30. The process according to claim 28, wherein said Ln is Sm.

31. The process according to claim 28, wherein said Ln is Eu.

32. The process according to claim 28, wherein said Ln is Gd.

33. The process according to claim 28, wherein said Ln is Dy.

34. The process according to claim 28, wherein said Ln is Ho.

35. The process according to claim 28, wherein said Ln is Er.

36. The process according to claim 28, wherein said Ln is Tm.

37. The process according to claim 28, wherein said Ln is Yb.

38. The process according to claim 1, wherein said Ln is selected from the group consisting of Nd, Sm, Dy, Ho, and combinations thereof.

39. The process according to claim 1, wherein said Ln is selected from the group consisting of Eu, Gd, Er, Tm, Tb, and combinations thereof.

40. The process according to claim 18, wherein said Ln is selected from the group consisting of Nd, Sm, Dy, Ho, and combinations thereof.

41. The process according to claim 18, wherein said Ln is selected from the group consisting of Eu, Gd, Er, Tm, Yb, and combinations thereof.

42. The process according to claim 28, wherein said Ln is selected from the group consisting of Nd, Sm, Dy, Ho, and combinations thereof.

43. The process according to claim 28, wherein said Ln is selected from the group consisting of Eu, Gd, Er, Tm, Yb, and combinations thereof.

44. The process according to claim 18, wherein said mixture is dispersed in an organic liquid material to form a slurry, wherein said aligning magnetizing field is applied to said mixture in said slurry, wherein the resulting aligned material is formed into a compact in said aligning magnetizing field by evaporating away said liquid, and wherein any organic material remaining in said compact evaporates or decomposes on heating below 500° C. leaving no significant residue.

45. The process according to claim 28, wherein said mixture is dispersed in an organic liquid material to form a slurry, wherein said aligning magnetizing field is applied to said mixture in said slurry, wherein the resulting aligned material is formed into a compact in said aligning magnetizing field by evaporating away said liquid, and wherein any organic material remaining in said compact evaporates or decomposes on heating below 500° C. leaving no significant residue.

* * * * *